US008358361B2

(12) United States Patent
Hasegawa (10) Patent No.: US 8,358,361 B2
(45) Date of Patent: Jan. 22, 2013

(54) A/D CONVERTER UNIT FOR IMAGE SENSOR

(75) Inventor: Jun Hasegawa, Iwate (JP)

(73) Assignee: Curious Corporation, Ichinoseki, Iwate (JP)

( * ) Notice: Subject to any disclaimer, the term of this patent is extended or adjusted under 35 U.S.C. 154(b) by 331 days.

(21) Appl. No.: 12/846,089

(22) Filed: Jul. 29, 2010

(65) Prior Publication Data

US 2011/0025895 A1 Feb. 3, 2011

(30) Foreign Application Priority Data

Aug. 3, 2009 (JP) ................................ 2009-180542

(51) Int. Cl.
  *H04N 3/14* (2006.01)
  *H04N 5/335* (2011.01)
  *H03M 1/12* (2006.01)
(52) U.S. Cl. ........................ 348/300; 341/155
(58) Field of Classification Search .............. 348/294, 348/300–308; 341/155–170; 250/208.1
See application file for complete search history.

(56) References Cited

U.S. PATENT DOCUMENTS

| 5,426,431 | A | 6/1995 | Ryu | |
|---|---|---|---|---|
| 6,818,933 | B2 * | 11/2004 | Henderson et al. | 257/290 |
| 7,250,897 | B2 * | 7/2007 | Oh | 341/169 |
| 7,319,423 | B2 * | 1/2008 | Augusto et al. | 341/155 |
| 7,375,672 | B2 * | 5/2008 | Muramatsu et al. | 341/164 |
| 7,375,751 | B2 * | 5/2008 | Lee et al. | 348/294 |
| 2005/0206548 | A1 * | 9/2005 | Muramatsu et al. | 341/172 |
| 2007/0024729 | A1 * | 2/2007 | Muramatsu et al. | 348/308 |
| 2007/0024730 | A1 * | 2/2007 | Muramatsu et al. | 348/308 |
| 2007/0024731 | A1 * | 2/2007 | Muramatsu et al. | 348/308 |
| 2009/0284629 | A1 * | 11/2009 | Nakao et al. | 348/294 |

FOREIGN PATENT DOCUMENTS

| JP | 6-152420 | | 5/1994 |
|---|---|---|---|
| JP | 2004-015208 | A | 1/2004 |
| JP | 2005-136540 | A | 5/2005 |

OTHER PUBLICATIONS

A. Krymski et al., "A High Speed, 500 Frames/s 1024×1024 CMOS Active Pixel Sensor," Photobit Corporation, 1999 Symposium on VLSI Circuits Digest of Technical Papers, pp. 137-138.
Woodward Yang et al., "An Integrated 800×600 CMOS Imaging System," 1999 IEE International Solid-State Circuits Conference, Digest of Technical Papers, pp. 304-305 and p. 471.

* cited by examiner

*Primary Examiner* — Kelly L Jerabek
(74) *Attorney, Agent, or Firm* — Rothwell, Figg, Ernst & Manbeck, P.C.

(57) ABSTRACT

A high-speed, high-resolution column A/D converter having a noise reduction function to eliminate a fixed pattern noise etc. is provided with a small circuit scale. Each column A/D converter includes a dual-output D/A converter for selecting two reference voltages from among a reference voltage group supplied in common to each column A/D converter, so as to output the two reference voltages to sandwich each sensor signal voltage input to each column A/D converter, along with a charge-redistribution D/A converter having a full scale determined by the above two reference voltages. Thus, the high-speed, high-resolution column A/D converter is achieved with a small circuit scale. Further, by the utilization of high-speed conversion capability, noise reduction is performed through digital calculation after the A/D conversion.

6 Claims, 7 Drawing Sheets

Prior Art

A/D CONVERTER UNIT FOR IMAGE SENSOR

CROSS-REFERENCE TO RELATED APPLICATIONS

This application is based upon and claims the benefit of priority from the prior Japanese Patent Application No. 2009-180542, filed on Aug. 3, 2009, the entire contents of which are incorporated herein by reference.

BACKGROUND OF THE INVENTION

1. Field of the Invention

The present invention relates to an A/D converter unit for an image sensor for converting the output of an analog image from the image sensor into digital data and in particular, an A/D converter unit appropriate for an image sensor having column arrangement.

2. Background of the Related Art

In a digital still camera and a mobile phone camera, conventionally, CCD and APS (active pixel sensor) CMOS image sensors have been in use. In accompany of higher resolution in recent years, the number of pixels tends to be increased. Meanwhile, there are also requirements for high speed continuous shooting, high frame-rate moving images, etc. In combination of the above two, requirement for reading out at high speed is becoming intensified. However, when the increase of the number of pixels or the acquisition of high-speed reading is intended, the number of pixel signals to be read out in a unit time must be increased, needless to say. Therefore, high speed is required in circuits for reading out signals and for converting the readout analog signals into digital signals. In CCD, which has been a mainstream imaging device until now, horizontal CCD has to be driven at high speed to perform high speed reading. This makes it difficult to reduce current consumption. Therefore, recently, the use of the APS CMOS image sensor is increasing. However, even when using the APS CMOS image sensor (hereafter expressed as CMOS image sensor or simply, image sensor), the situation is that, to achieve high speed with maintained high resolution, the increase of current consumption in an A/D converter to convert analog signals into digital signals is inevitable.

As one method to solve the above problem, in case of the CMOS image sensor, because it is easy to integrate CMOS circuits into an identical chip, several methods using a so-called column-parallel A/D converters have been proposed. By use of the column A/D converter, pixel signals from the image sensor are output column-by-column in parallel, and the image signals of each column are converted into digital data simultaneously in parallel.

For example, in the non-patent document 1, a method using a successive approximation A/D converter composed of capacitors is disclosed. According to this method, an A/D conversion circuit is configured of comparator, D/A conversion circuit and successive approximation register. Because high performance operational amplifier is not necessary, the method is suitable for a column A/D converter that requires arrangement with a narrow pitch. The method is highly promising because of high conversion speed also. However, when a general charge-redistribution D/A conversion circuit is used, a plurality of weighted capacitors are to be arranged. For example, in order to perform A/D conversion with the resolution of 10 bits, it is necessary to provide totally 1024 pieces of unit capacitors having 1C to 512C. Therefore, even if fine process will be advanced in future, variation of elements may be increased when the capacitor size is made smaller. This causes deteriorated performance of A/D conversion, and it is not possible to reduce the capacitor area accordingly. Thus, the method has a defect that realization of high resolution is difficult in a column A/D converter requiring a narrow pitch formation.

Also, in the non-patent document 2, there is disclosed a method using a so-called single-slope A/D converter includes a ramp signal generator, a comparator and a counter. This method has merits of being suitable for column arrangement because of the use of a small number of elements, and being achievable without use of an operational amplifier, similar to the aforementioned successive approximation A/D converter. However, to improve the resolution in A/D conversion, a time required for the A/D conversion increases in the manner of an exponential function. This produces a serious demerit of difficulty in obtaining high resolution.

Also, as a column A/D converter, a method using a ΔΣ type is disclosed in the patent document 1, and also, a method using a cyclic type is disclosed in the patent document 2. Both types require high performance operational amplifiers because of requiring highly accurate calculation by switched capacitor circuits. However, it is becoming difficult in recent years to arrange such highly accurate operational amplifiers into columns with a slender-shaped layout to fit to a narrow pixel pitch. The reason is that it is necessary to use transistors manufactured under fine design rules to reduce the layout size. Such a fine transistor has a low voltage tolerance that requires a low power supply voltage, and therefore, it is not possible to ensure enough dynamic range of the operational amplifier.

From the above discussion, when column arrangement with a narrow pitch is taken into consideration, the successive approximation method not necessitating operational amplifiers or the single slope method are left as candidates. From the viewpoint of high speed, the single slope method is extremely difficult. On the other hand, to obtain a multi-bit A/D converter unit using the aforementioned simple charge-redistribution successive approximation A/D converters, an extremely large number of elements are required, which is unsuitable for a column A/D converter having a large restriction in size.

Figure 13:
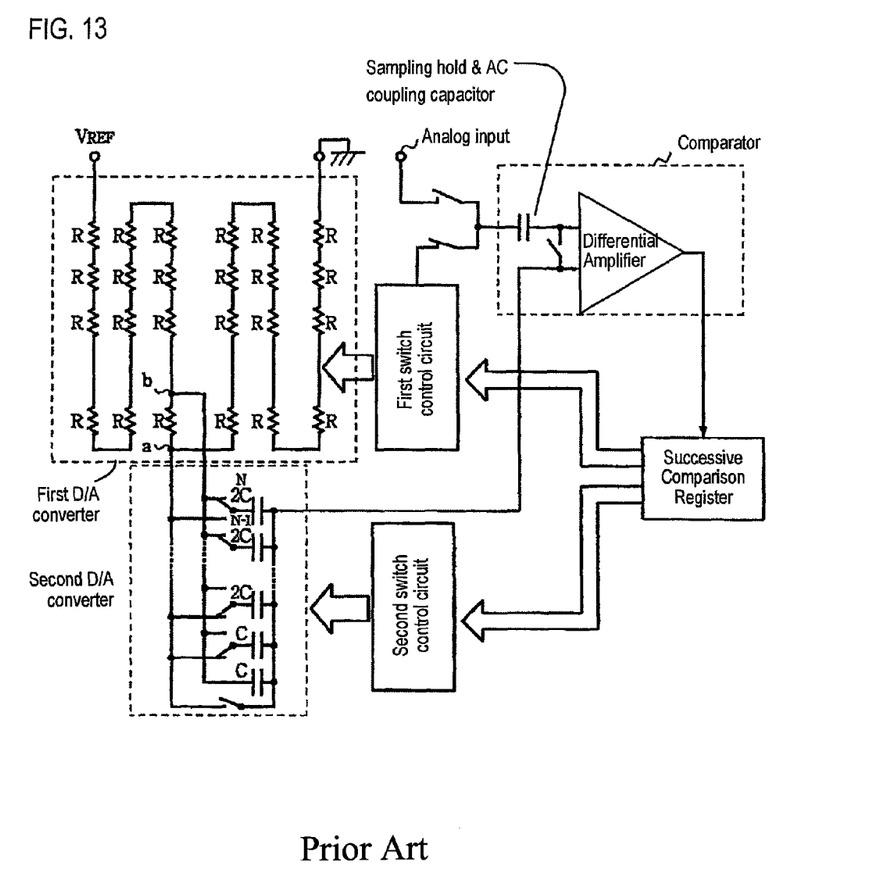
FIG. 13 is an example of the conventional successive approximation A/D converter to achieve high resolution.

Meanwhile, though it is not a column A/D converter, in the patent document 3, there is disclosed the prior art for obtaining high resolution with a reduced number of elements. FIG. 13 shows the block diagram thereof. A D/A converter for use in successive approximation is divided into an upper level and a lower level. A resistor-string D/A converter is used for the upper-level D/A converter. Also, a so-called charge-redistribution D/A converter, composed of capacitors and switches, is used for the lower-level D/A converter. The respective outputs therefrom are added by the input to a comparator. Thus, a high-resolution, high-speed A/D converter unit with a reduced number of elements is obtained.

However, if it is intended to apply the above-mentioned method intact to a column A/D converter, there are problems described below. One is that, if it is intended to include the resistor string in each column A/D converter, the resistor area is too large to fit in a narrow pitch. The other is that the outputs of the resistor string DAC and the charge redistribution DAC are consequently added by the use of capacitors in the comparator. Therefore, in order to ensure addition accuracy in the upper-level and lower-level D/A converters, it is necessary to make the capacitor size, which is used for the addition in the comparator, sufficiently larger than the capacitor size for use in the second D/A converter, so as to suppress capacitance variation. Further, as shown in FIG. 13, a reference voltage to be input to the second D/A converter is extracted from the both ends (a, b) of one fixed resistor in the resistor string. Therefore, if variation exists in each unit resistor forming the resistor string, the variation leads to the deterioration of a nonlinearity error. To ensure accuracy, the unit resistor size has to be enlarged. This causes a drawback that the overall circuit area becomes large. As such, the method disclosed in the patent document 3 is quite suitable when it will be applied to a single A/D converter having a relatively gentle size restriction. However, it is not suitable for a column A/D converter having a strict restriction of size.

[Preceding Technical Documents]
[Patent Documents]
[Patent document 1] Japanese Unexamined Patent Publication No. 2004-15208.
[Patent document 3] Japanese Unexamined Patent Publication No. 2005-136540.
[Patent document 3] Japanese Unexamined Patent Publication No. Hei-6-152420.
[Non-Patent Documents]
[Non-patent document 1] A. Krymski, D. van Blerktom, A. Andersson, N. Block, B. Mansoorian and E. R. Fossum, "A high speed 500 Frames/s 1024×1024 CMOS Active Pixel Sensor", 1999 Symposium on VLSI Circuits Digest of Technical Papers pp. 137-138.
[Non-patent document 2] Woodward Yang, Oh-Kwon, Ju-Il Lee, Gyu-Tae Hwang and Suk-Joong Lee, "An Integrated 800×600 CMOS Imaging System", 1999 IEEE Int. Solid State Circuits Conference pp. 304-305, 471.

SUMMARY OF THE INVENTION

Accordingly, in consideration of such an actual situation, it is an object of the present invention to provide an A/D converter unit using a column A/D converter of a reduced size, enabling high-speed readout as well as high resolution.

To solve the aforementioned problems, according to the present invention, there is provided an A/D converter unit for an imaging sensor, comprising: a plurality of column A/D converters for converting a plurality of analog image signals being output from the image sensor on a column-by-column basis into digital data simultaneously in parallel, and a reference voltage group supplier for supplying a reference voltage group having a plurality of reference voltages, wherein each column A/D converter includes a first D/A converter for selecting and outputting two reference voltages from among the reference voltage group, a second D/A converter for outputting a voltage ranging between an upper limit and a lower limit each determined by each of the two reference voltages output from the first D/A converter, a comparator for comparing each analog image signal voltage being output from the image sensor with the output voltage of the second D/A converter, and based on the output of the comparator, a controller for controlling the first and the second D/A converters so as to produce the output voltage of the second D/A converter substantially equal to each analog image signal voltage.

According to the present invention, it is possible to obtain an A/D converter unit using a high-resolution, high-speed column A/D converter with a reduced size. Further, even in a high-definition image sensor having a large number of pixels with a narrow pitch of pixel arrangement, it is possible to obtain a function of being capable of outputting high-quality digital image signals at a high frame rate.

DETAILED DESCRIPTION OF THE INVENTION

Hereafter, the embodiments of the present invention will be described with reference to the accompanied drawings.

Embodiment 1

Figure 1:
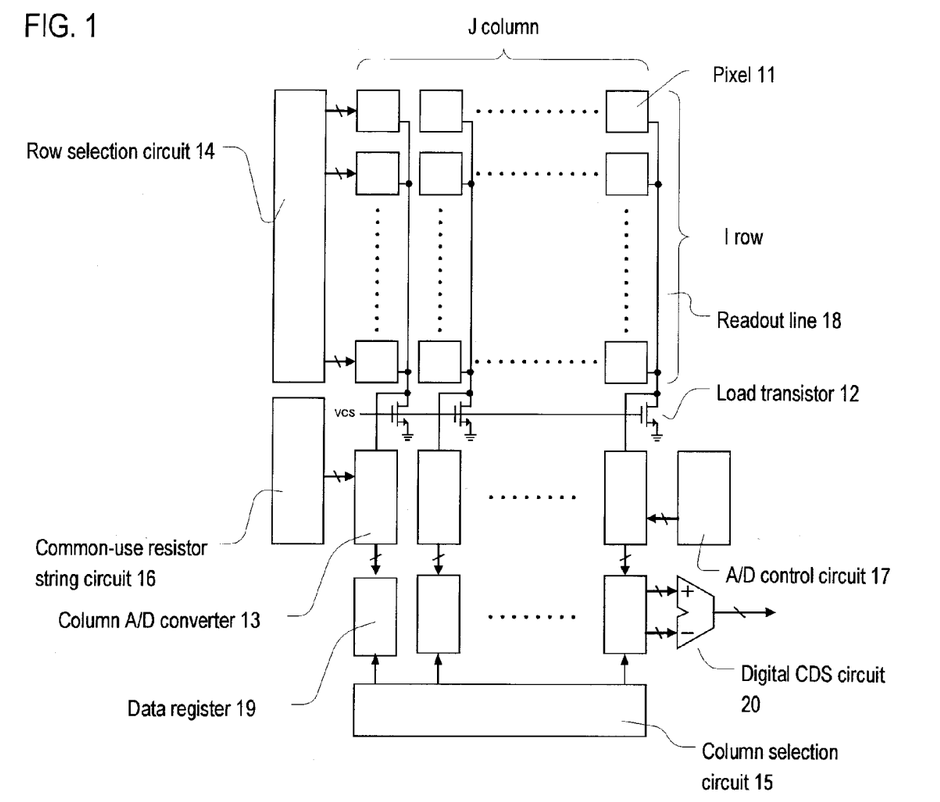
FIG. 1 is a block diagram illustrating an overall configuration of an image sensor according to the present embodiment.

FIGS. 1 through 12 show an embodiment of the invention, in which like symbols designate like parts. FIG. 1 is a block diagram illustrating an overall configuration of an image sensor according to the present embodiment. A pixel (11) to which photoelectric conversion is to be performed is arranged in a two-dimensional matrix of I rows and J columns. Each pixel in a row selected by a row selection circuit (14) is connected to a readout line (18) of each column. By that a bias current is supplied by a load transistor (12), a signal of the selected pixel is output from a sensor signal output terminal (Vread). In an APS CMOS image sensor, to avoid an influence caused by a pixel-by-pixel difference of readout transistor threshold voltages and a reset noise represented by a kTC noise etc., a signal charge amount stored in a photodiode has to be obtained with accuracy. For this purpose, a method called CDS (Correlated Double Sampling) is generally used, by which a difference is obtained between a reset level voltage before the signal charge readout stored in the photodiode and a signal level voltage after the signal charge readout stored in the photodiode. Further, in the column A/D converter itself of the successive stage, to avoid an influence of a comparator input offset, so-called digital CDS is performed as shown in the [Non-patent document 3], in which a difference between the reset level voltage and the signal level voltage is obtained in the form of digital signals after the respective A/D conversion thereof. For this purpose, in a reset period in which the reset level is being output from the Vread terminal, each column A/D converter (13) performs first A/D conversion, and transfers the digitized reset level data (hereafter expressed as reset data) to a data register (19). Thereafter, in a signal period in which the signal level voltage is being output from the Vread terminal, each column A/D converter (13) performs next A/D conversion, and transfers a digitized signal level data (hereafter expressed as signal data) to the data register (19). Additionally, an A/D control circuit (17) is provided for generating a common signal to control each column A/D converter (13).

When a selection signal corresponding to each column is successively supplied from a column selection circuit (15) to each data register (19), the reset data and the signal data stored therein are simultaneously output to a bus line. Finally, a digital calculation of subtracting the reset data from the signal data is made in a digital CDS circuit (20), and a pixel data corresponding to a signal charge quantity stored in the photodiode is output externally. Since the column selection circuit (15) sequentially outputs column selection signals to columns in time series, pixel data are output from the digital CDS circuit (20) in time series.

By the arrangement of a plurality of resistors of equal resistance between two voltages, a common-use resistor string circuit (16) generates, and supplies to the entire column A/D converters, a reference voltage group having a plurality of reference voltages that are voltage-divided at equal intervals between two voltages. Here, when there is a large variation of resistance among each resistor forming the resistor string, the voltage intervals in the reference voltage group also come to have variation. This produces a deteriorated characteristic of the column A/D converter. Therefore, it is necessary to manufacture each resistor forming the resistor string with high accuracy. To suppress the variation of each resistor, it is necessary to make it large in size. However, even if the resistor size becomes large to some extent, an impact given to the entire device is not so large, because the resistor string is used in common. Further, it is necessary to set the output impedance of each reference voltage generated by the above resistor string as low as possible, because the output impedance affects an A/D conversion time. This produces a relatively large current. However, because the resistor string circuit (11) is used in common, the consumption current in terms of per column A/D converter is negligible small, and therefore no major problem arises.

Figure 2:
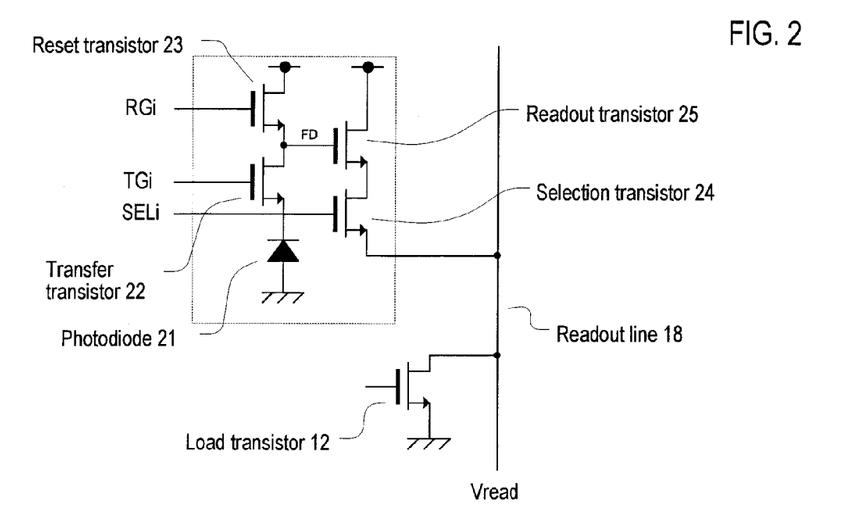
FIG. 2 is a diagram illustrating a pixel and a readout circuit shown in FIG. 1.
Figure 3:
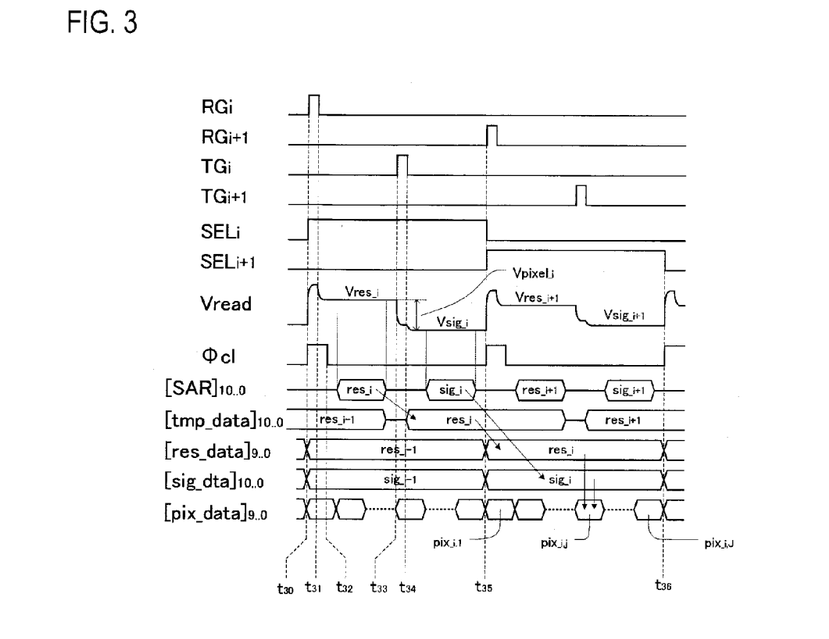
FIG. 3 is an overall operation timing chart of an image sensor.

FIG. 2 is a diagram illustrating pixels and load transistors shown in FIG. 1. Further, FIG. 3 is a diagram illustrating overall operation timing. A photodiode (21) generates an electrical charge corresponding to incident light quantity. When a transfer transistor (22) is in an OFF state, the entire generated charge is stored in the photodiode. On completion of the storage for a predetermined period, at time t30, a selection signal (SELi signal) corresponding to a pixel positioned in an i-th row is set to a high level. Thus, a selection transistor (24) is switched ON, and the source of a readout transistor (25) is connected to a readout line (18). When a reset transistor (23) is switched ON by means of a reset signal (RGi signal) to reset the floating diffusion (FD) of the pixel in the i-th row, an FD node is reset to a power supply voltage. Thereafter, at time t31, by the reset transistor switched OFF, the FD node comes into a floating state and a standby state for receiving a signal charge. An FD voltage at this time is output as a reset level voltage (Vres_i) by means of the readout transistor and the load transistor (12) configuring a source follower circuit. Thereafter, at time t33, by that a transfer signal (TGi) in the i-th row is switched ON, the transfer transistor is switched to an ON state, and thereby the signal charge stored in the photodiode is transferred to the FD. Thereafter, at time t34, by the transfer transistor switched OFF, the transfer operation of the signal charge to the FD is completed. The FD voltage at this time is output as a signal level voltage (Vsig_i), by means of the readout transistor and the load transistor configuring the source follower circuit. Both the reset level voltage before signal charge transfer and the signal level voltage after signal charge transfer are A/D converted and stored into the data register (19) as digital data (res_i, sig_i). Additionally, a bias voltage (VCS) is applied to the gate of the load transistor (12) to make a constant current.

The stored reset data and the signal data are retained during the next period from time t35 to time t36 in which an (i+1)-th row is selected. In the digital CDS circuit (20), in order of selection by the column selection circuit (15), a difference between the signal data and the reset data is obtained. A pixel data (pix_i,j) thus obtained is output in time series. As described above, by the intermediary of the data register (19), the A/D conversion of each sensor signal of the (i+1)-th row and the data output of each pixel of the i-th row can be performed simultaneously in parallel. Thus, the loss of time can be minimized.

Figure 4:
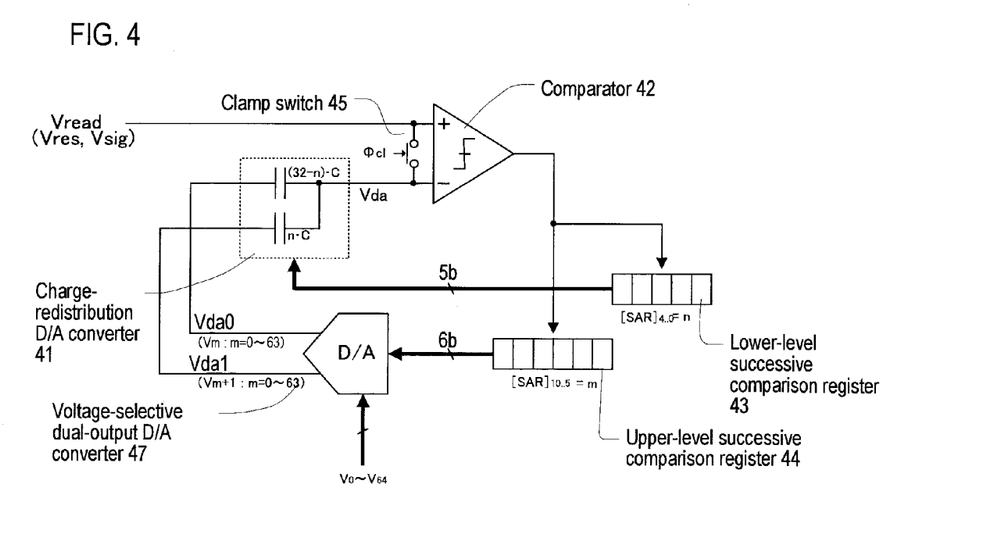
FIG. 4 is a block diagram of each column A/D converter.

FIG. 4 is a block diagram of the column A/D converter (13) shown in FIG. 1. The sensor signal (Vread) of each column is connected to a non-inverted input terminal of a comparator (42), and the output of a charge-redistribution D/A converter (41) is connected to an inverted input terminal of the comparator. Further, a clamp switch (45) is arranged between the two input terminals of the comparator. The charge-redistribution D/A converter (41), whose detailed configuration will be described later, is configured of two capacitors connected in parallel, having such capacitance values that one is n×C and the other is (32−n)×C that are variable depending on the magnitude of the integer value n. In regard to the above capacitors, each one end is commonly connected to the inverted input of the comparator (42) as Vda, while the other ends are connected to the outputs of Vda0, Vda1 of a voltage-selective dual-output D/A converter (47), respectively.

To the voltage-selective dual-output D/A converter, voltages Vm (m=0 to 64) of equal intervals generated by a common-use resistor string circuit (11) are supplied, as will be described later in detail. Dependent on an input digital data "m", Vda0 outputs a voltage Vm, and Vda1 outputs a voltage (Vm+1), respectively. The output of the comparator (42) is supplied to an upper-level successive approximation register (44) and a lower-level successive approximation register (43). Each register value is determined on the basis of the comparator output. (Hereafter, the upper-level successive approximation register will be expressed as upper-level SAR, and the lower-level successive approximation register will be expressed as lower-level SAR.) The "m" i.e. the upper-level SAR value determines the output of the voltage-selective dual-output D/A converter (47), while the "n" i.e. the lower-level SAR value determines the ratio of the two capacitance values of the capacitors in the charge-redistribution D/A converter (41).

Figure 5:
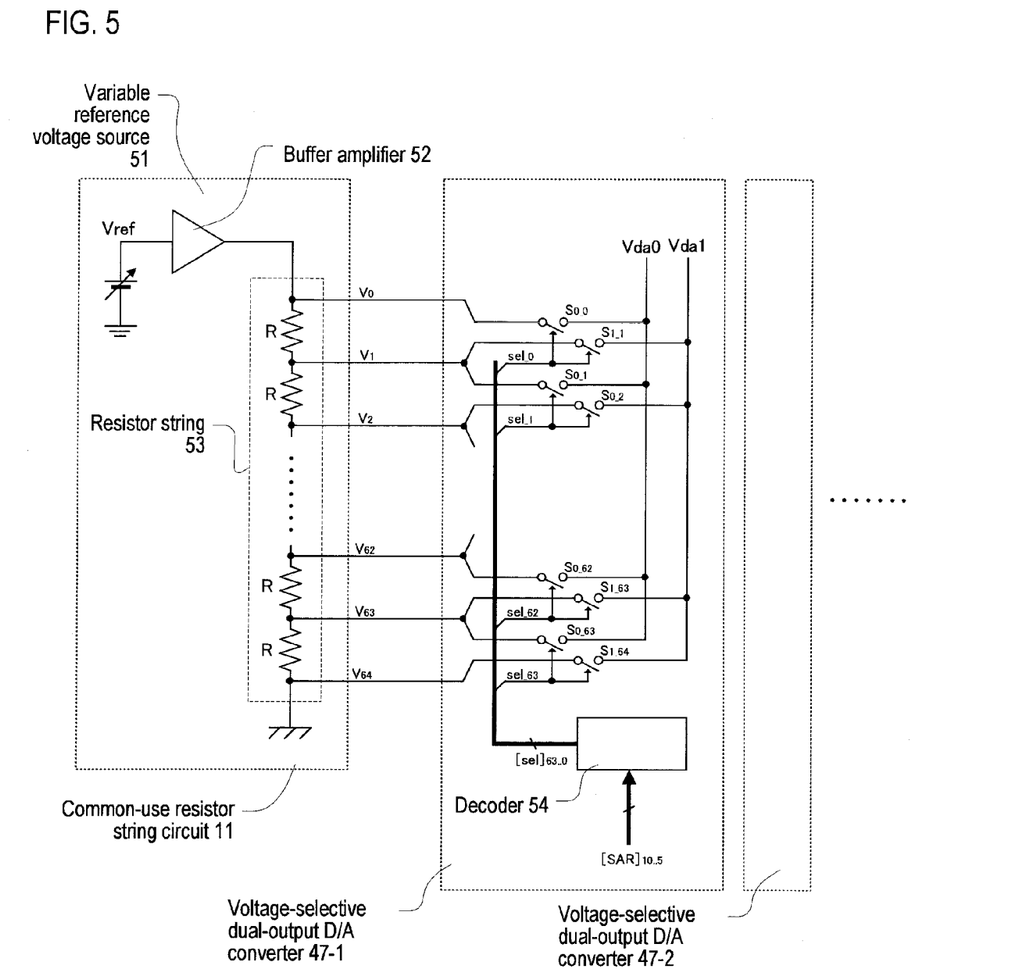
FIG. 5 is a circuit diagram of a common-use resistor string circuit and a voltage-selective dual-output D/A converter for use in each column A/D converter.

FIG. 5 is an explanation diagram illustrating a common-use resistor string circuit (11) along with a voltage-selective dual-output D/A converter (47) in each column A/D converter (13). The common-use resistor string circuit (11) is configured of a resistor string that includes 64 unit resistors (R) of an identical size and shape. One end of the resistor string circuit (11) is connected to GND, and to the other end, a voltage (Vref) of a variable reference voltage source (51) is applied via a buffer amplifier (52). Accordingly, to the 64 unit resistors, the voltage Vref is applied totally. From a connection point of each unit resistor, a voltage expressed by $Vm=\{(1-(m/64)\} \times Vref$ in correspondence with the value of m, namely a voltage obtained from equally dividing Vref into 64 gradation steps, is obtained.

In the voltage-selective dual-output D/A converter (47) in each column A/D converter, a data (m) consisting of 6 bits of the upper-level SAR is input to a decoder (54). The decoder works in such a manner as to set any one of selection signals (sel_0 to sel_63) to be ON and the remainders to be OFF. For example, in case that the upper-level SAR has a value m=62, only the sel_62 signal becomes ON. Thereby a switch (S0_62) becomes conductive and a voltage V62 appears as a Vda0 output. At the same time, a switch (S1_63) becomes also conductive, and V63 appears as a Vda1 output. As such, if the upper-level SAR data is "m", the voltage of Vda0 becomes Vm, and the voltage of Vda1 becomes Vm+1. In other words, it can be said that, from Vda0 and Vda1, there are output voltages on both ends of a unit resistor positioned at the (m+1)-th from the top of the resistor string.

In addition, the layout areas of the above switches and the decoder can be minimized by use of fine transistors accompanying the progress of process technology in recent years. Thus, the circuit scale of the overall A/D conversion circuit can be integrated to a level suitable for column arrangement. Also, because the reference voltage group (V0 to V64) is generated by the common-use resistor string (11) and supplied to the entire column A/D converters, no resistor is required in the column A/D converters. This enables to realize a highly accurate column A/D converter with a small circuit scale. Namely, in order to achieve a highly accurate column A/D converter, it is necessary to suppress variation among resistor elements for use in a resistor string, which generally requires a large element area. However, by making in common the resistor string requiring such a large area, enabling the disposition thereof outside each column A/D converter, the occupation area of configuration elements necessary for one column A/D converter can be reduced. In particular, it is possible to reduce the occupation area of passive elements of which size cannot be reduced even by fine process. Further, by making a bias circuit in common, an identical voltage can be supplied to each column A/D converter. Thus, characteristic variation among each column A/D converter can also be suppressed.

Additionally, if the voltage of the variable reference voltage source (51) is varied, a full-scale range of the voltage-selective dual-output D/A converter (47) is varied. This produces a varied input range of the column A/D converter. By this, equivalently amplification (or attenuation) of sensor signals can be achieved. More specifically, when the quantity of light irradiated on the sensor is small and the sensor output range is small, it is possible to reduce a quantization error by narrowing the full scale of the A/D converter to fit to the light quantity. Consequently, the same effect is obtainable as the amplification of a sensor output before A/D conversion. In general, when amplifying the sensor output before inputting to the column A/D converter, an amplification circuit becomes necessary in each column A/D converter. Moreover, an image noise of a vertical stripe shape undesirably appears due to the variation of an amplification factor in each amplification circuit. In contrast to the problems described above, according to the present invention, an extra circuit is unnecessary in the column A/D converter itself, because the full-scale voltage can be changed only by the common-use resistor string (11). Further, signal amplification can be performed in a quite suitable manner because of no characteristic variation among each column A/D converter. Moreover, when operation suspension of the image sensor is desired due to some reason on the system, the voltage Vref is simply made zero, so that no current flows in the resistor string. Thus, consumption current can be reduced without addition of a complicated mechanism.

Figure 6:
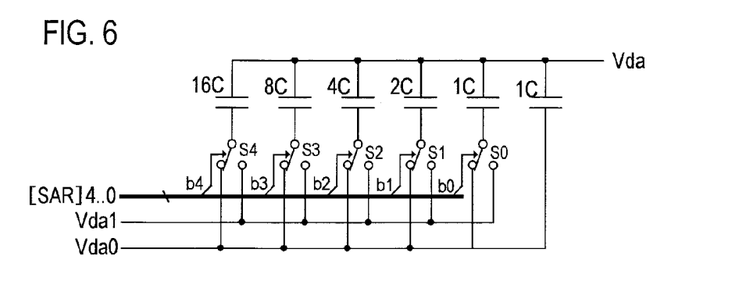
FIG. 6 is a circuit diagram of a charge-redistribution D/A converter for use in each column A/D converter.

FIG. 6 is a diagram illustrating the detail of the charge-redistribution D/A converter (41) shown in FIG. 4. Basically, it is configured of binary weighted 1C through 16C capacitors, and two-input selection switches respectively connected thereto. When "n" is output from the lower-level SAR, each switch (S0 to S4) corresponding thereto is made ON or OFF. The capacitors connected to the switches that are ON are connected to the Vda1 side, while the capacitors connected to the switches that are OFF are connected to the Vda0 side. In addition, a capacitor (10) directly connected Vda0 is provided without intermediary of any switch. In case of n=0, causing the entire switches are OFF, the entire capacitors (32C) are connected to Vda0. On the other hand, in case of n=31, causing the entire switches are ON, only capacitor of 1C is connected to Vda0, and the remaining capacitors of 31C in total are connected to Vda1. As such, using the value "n" being set in the lower-level SAR, a capacitance value connected between the Vda terminal and the Vda0 terminal can be expressed as (32−n)C, while a capacitance value connected between the Vda terminal and the Vda1 terminal can be expressed as nC. As such, depending on the value n (0 to 31), it is possible to set a capacitance ratio in 32 steps.

Here, let the voltage of Vda0 be Vm, and the voltage of Vda1 be Vm+1, and let the capacitance between Vda and Vda0 be (32−n)C and the capacitance between Vda and Vda1 be nC, respectively. Then, as shown below, a voltage appearing at Vda is obtained by internally dividing Vm and Vm+1 by the capacitance ratio of C to nC.

$$Vda=(1-(n/32))\times Vm+(n/32)\times(Vm+1)$$

The above equation signifies that, by a set value of n, one voltage obtained by equally dividing a voltage between Vm and Vm+1 by 32 can be selected and output. Namely, the fact that the voltage obtained as Vda continuously ranges between Vm and Vm+1 signifies that one LSB unit of the upper-level voltage-selective dual-output D/A converter is continuously equal to the full-scale range of the lower-level charge-redistribution D/A converter, irrespective of the value of "m". By this, it is possible to achieve a column A/D converter quite suitable for an image sensor, without producing extreme deterioration of differential nonlinearity or missing codes that may largely affect image quality.

Subsequently, the operation of the present circuit will be described. First, clamping operation will be explained with reference to the overall operation timing chart shown in FIG. 3 and the explanation diagram of clamping operation shown in FIG. 7. As shown in FIG. 3, at time t32 when a sensor output (Vread) stably outputs a reset level voltage (Vres) after pixel reset operation is completed, a clamp switch (45) is switched OFF by φcl. In this period, "00000b", namely n=0 is output from the lower-level SAR. Accordingly, the entire switches in the charge redistribution DAC (41) are OFF, and the entire capacitors (32C) are connected between Vda0 and Vda. At this time, "010000b", namely m=16 is output from the upper-level SAR, so that Vda0 outputs V16. In this state, when φcl is switched OFF, so that the clamp switch (45) is switched OFF, the reset level voltage is clamped to V16 as a base level.

Figure 7:
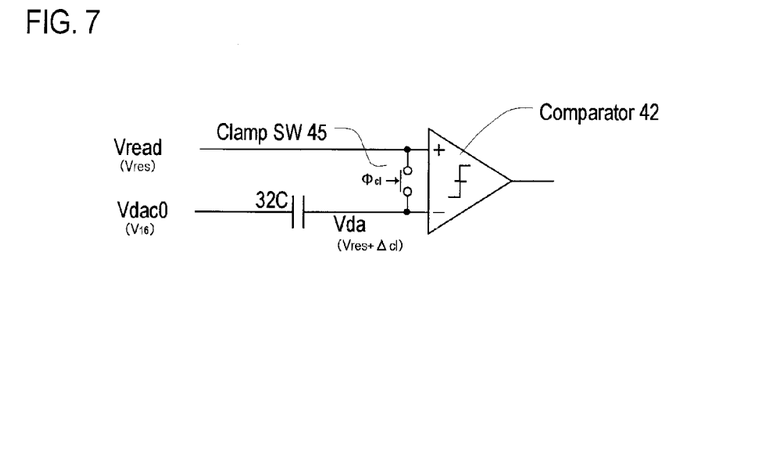
FIG. 7 is an equivalent circuit diagram for explaining clamping operation.

When clamping is made in an ideal state, the Vda voltage becomes equal to the Vres voltage, and the comparator cannot decide which is larger or smaller, and outputs so-called an "X" state that is neither "H" nor "L". However, actually, due to various reasons such as clock field through of the clamp switch (45), charge injection, kTC noise and an offset of the comparator, the output of the comparator does not become "X". In other words, a clamping error exists. To cancel the clamping error, the reset level voltage, including the above clamping error (ΔVcl), is digitized into a reset data through A/D conversion. Then, through digital calculation, a sensor output voltage changed into a signal level voltage is subtracted from a signal data obtained through A/D conversion executed again. In addition thereto, if ordinary CDS to obtain a difference between the signal level and the reset level is also performed, an accurate pixel data can be obtained. In addition, when clamping the reset level, the reason for using V16, instead of V0, as the base level of the Vda0 output is that the error (ΔVcl) at the time of clamping can take either a positive or negative voltage, particularly depending on the input offset of the comparator. Here, when the reset level voltage including ΔVcl is A/D converted, it is assumed that, in the worst case, the output voltage Vda0 can take a value ranging from V0 to V32 with the center voltage V16.

Figure 8:
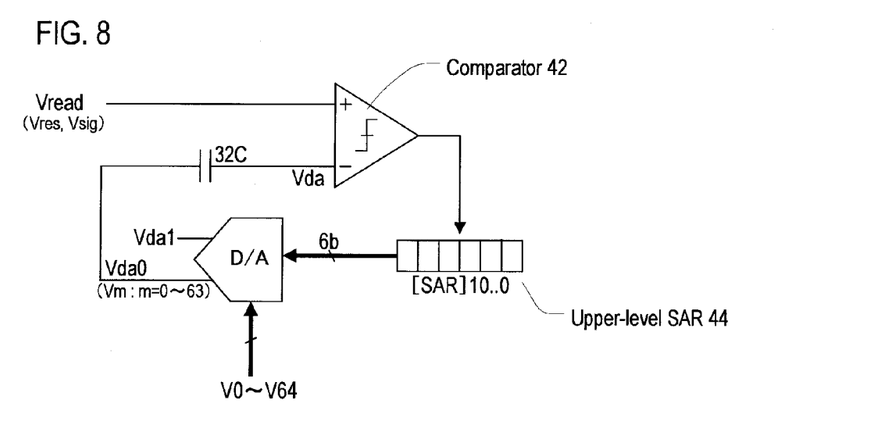
FIG. 8 is an equivalent circuit diagram for explaining upper-level successive approximation operation.

Next, a description will be given on A/D conversion operation. Basically, in view of operation, the reset level A/D conversion is exactly identical to the signal level A/D conversion, and therefore the description will be given on the exemplary case of A/D conversion of a signal level voltage (Vsig). First, the upper-level A/D conversion will be described using an explanation diagram of upper-level successive approximation operation, shown in FIG. 8, and a timing chart of upper-level successive approximation operation shown in FIG. 10. In FIG. 8, an equivalent circuit during the upper-level successive approximation operation is shown. Here, the clamp switch (45) is not shown because it is kept OFF. In this state, the lower-level SAR has "00000b" namely n=0, and the entire capacitors (32C) in the charge redistribution DAC (41) are connected between Vda0 and Vda. Namely, the output of Vda0 of the voltage-selective dual-output D/A converter (47) is connected to an inverted input terminal of the comparator through 32C. Therefore, by means of capacitance coupling, a variation of the Vda0 voltage is transmitted intact to a voltage variation of the Vda terminal.

Figure 10:
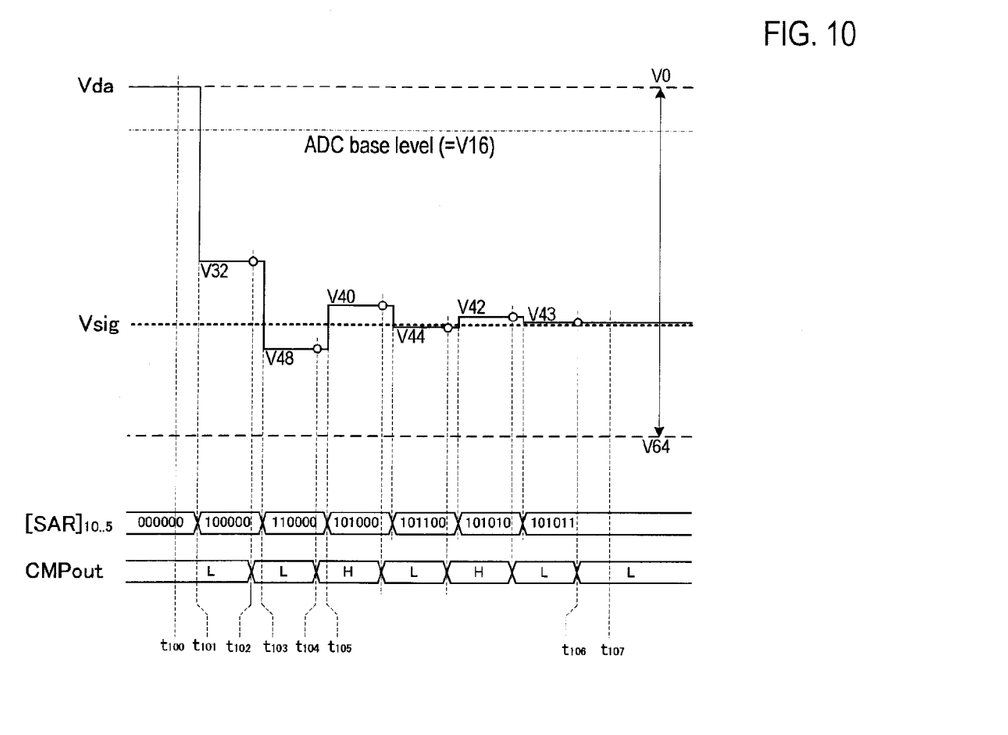
FIG. 10 is a timing chart of upper-level successive approximation operation.

At time t100, the upper-level SAR has an initial value "000000b", and because of m=0, Vda0 outputs V0. Next, at time t101, MSB (bit#10) is set to "1" from "0", so that the output data of the upper-level SAR is changed to "100000b". Because m becomes 32, Vda0 is lowered to V32 relative to V0. The above voltage change is transmitted to Vda, so as to decrease the Vda voltage. At time t102, in comparison of voltages between present Vsig and Vda, Vda>Vsig holds. Accordingly, the comparator (42) outputs "L". This signifies that a Vda voltage level does not reach a Vsig voltage level. Accordingly, at time t103, the bit lower by one (b9) is set to "1" from "0", while the MSB is left unchanged as "1". By this, the upper-level SAR register comes to have "110000b", namely n=32+16.48, so that the Vda0 voltage is further decreased from V32 to V48, i.e. a decrease equivalent to 16 upper-level LSB. At time t104, in comparison of voltages between Vsig and Vda, Vda<Vsig holds. Accordingly, the comparator (42) outputs "H". This signifies that the Vda voltage level exceeds the Vsig voltage level. Accordingly, the bit#9 is "cleared" to "0" from "1", and further, the bit lower by one (bit#8) is "set". By this, the upper-level SAR register comes to have "101000b", namely m=32+8=40, so that the Vda0 voltage is changed to V40.

By repeating the aforementioned operation for the number of times equal to the number of bits of the upper-level SAR, a difference between the Vda voltage and the Vsig voltage becomes smaller, and finally, at time t106 when the decision of bit#5 is completed, the final comparison of the upper-level successive approximation is completed. Thus, in the upper-level SAR, "101011b", namely m=43 is obtained. Further, at time t107, the upper-level successive approximation operation is completed in the state that the comparator output in the comparison between Vda and Vsig is "L", namely Vda>Vsig.

Figure 9:
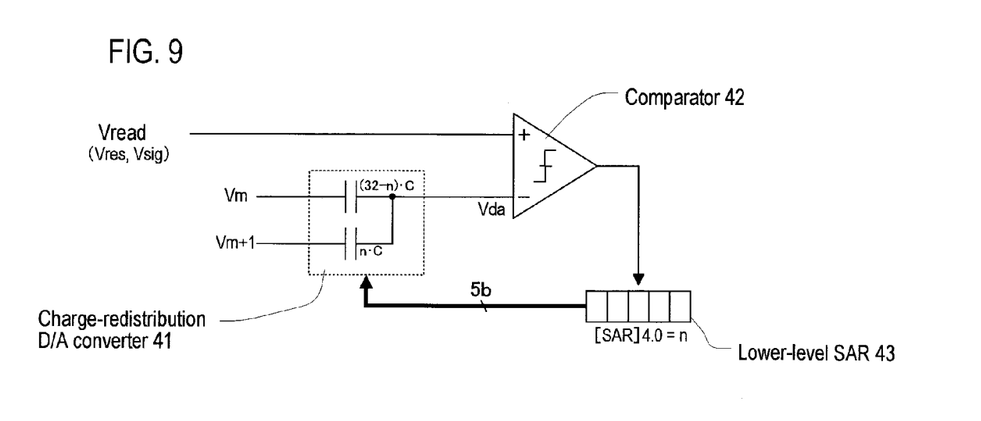
FIG. 9 is an equivalent circuit diagram for explaining lower-level successive approximation operation.
Figure 11:
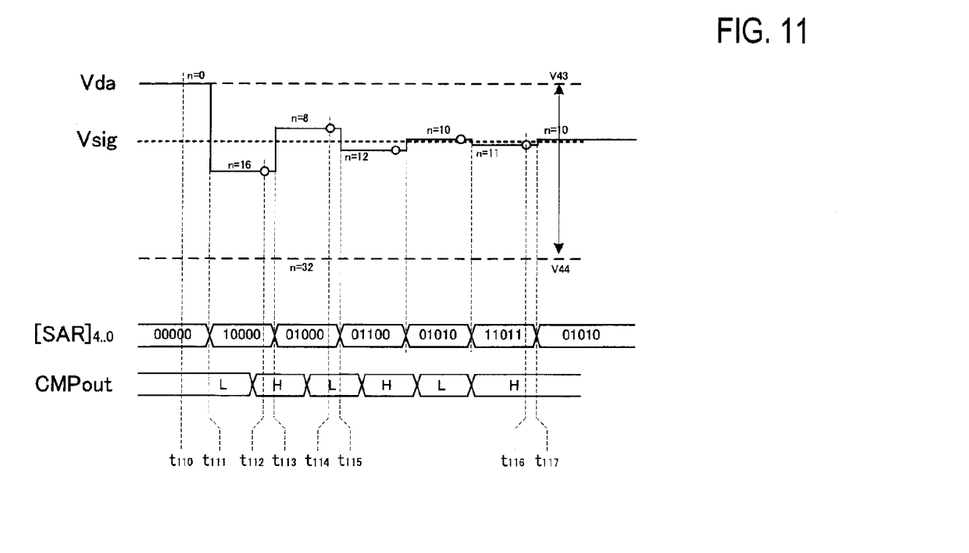
FIG. 11 is a timing chart of lower-level successive approximation operation.

Subsequently, a description will be given on the lower-level A/D conversion, using an explanation diagram of lower-level successive approximation operation, shown in FIG. 9, and a timing chart of lower-level successive approximation operation shown in FIG. 11. In FIG. 9, an equivalent circuit during the lower-level successive approximation operation is shown. In this case also, the clamp switch (45) is not shown because it is kept OFF. In this state, because the upper-level SAR finally comes to have m=43, there is generated a state in which V43 is output from Vda0 of the voltage-selective dual-output D/A converter (47), and also V44 is output from Vda1.

In the initial state of time t110, the lower-level SAR remains to be "00000b", namely n=0, and the entire capacitors in the charge redistribution DAC (41) are connected between Vda0 and Vda. At time t111, the MSB (bit#4) of the lower-level SAR is set to be "10000b", namely n=16. Thus, the capacitors connected between Vda0 and Vda come to have 16C, and the capacitors connected between Vda1 and Vda also come to have 16C. As can be calculated from the aforementioned equation, Vda becomes $(16/32) \times V43 + (16/32) \times V44 = 0.5 \times V43 + 0.5 \times V44$. This gives a voltage decreased by 0.5 LSB, when expressed by conversion to LSB units of the upper-level DAC, from a voltage level V43 obtained after the completion of the upper-level successive approximation. At time t112, in comparison of the above Vda with Vsig, Vda<Vsig holds. Accordingly, the comparator (42) outputs "H". This signifies that the Vda voltage level exceeds the voltage level of Vsig. Accordingly, at time t113, the set bit#4 is cleared, and also the bit lower by one (bit#3) is set. By this, the lower-level SAR comes to have "01000b", namely n=8, and the capacitors connected between Vda0 and Vda come to have 24C. As can be calculated from the aforementioned equation, Vda becomes $(24/32) \times V43 + (8/32) \times V44 = 0.75 \times V43 + 0.25 \times V44$. Thus, a voltage decreased by 0.25 LSB from the original V43 is given. At time t114, in comparison of the above Vda with Vsig, Vda>Vsig holds. Accordingly, the comparator (42) outputs "L". This signifies that the Vda voltage level does not reach the Vsig voltage level. Accordingly, at time t115, the bit lower by one (bit#2) is set, while a state of "1" in bit#3 is left unchanged.

By repeating the aforementioned operation for the number of times equal to the number of bits in the lower-level SAR, a difference between the Vda voltage and the Vsig voltage becomes smaller. At the time point of t116 when the final decision of bit#0 (final comparison of the lower-level successive approximation) is completed, if Vda<Vsig is satisfied, at time t117, bit#0 is cleared and the lower-level successive approximation operation is completed in the state that the lower-level SAR has "010010b".

As such, the description has been given on the case that the output of the Vread terminal is a signal level voltage. In the case that the output of the Vread terminal is a reset level voltage, A/D conversion is carried out using the same method. Each digital data having a total depth of 11 bits, which is a total of the converted 6-bit data of the upper-level SAR and the 5-bit data of the lower-level SAR, is transferred to the data register (19) and retained therein.

Figure 12:
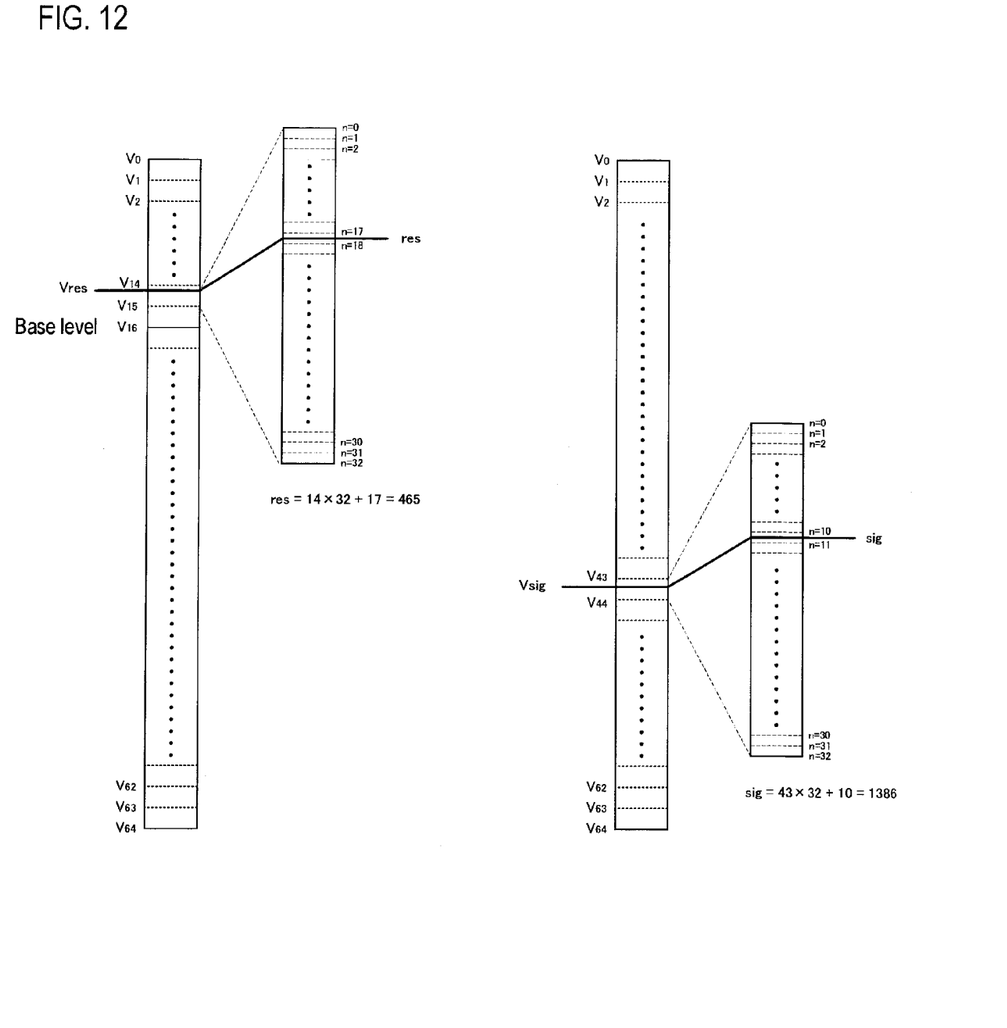
FIG. 12 is an explanation diagram of the digital CDS.

Finally, digital CDS operation will be described with reference to FIG. 12. As described earlier, the reset level voltage is set to be within the range from V0 to V32, centering V16. For example, in case that, after the A/D conversion of the reset level voltage, m=14 in the upper-level SAR and n=17 in the lower-level SAR are obtained, a value of res=14×32+17.465 is obtained when a weight ratio (×32) between the upper level and the lower level is taken into consideration. Further, in the subsequent signal level A/D conversion, for example, in case that m=43 in the upper-level SAR and n=10 in the lower-level SAR are obtained, a value of sig=43×32+10.1386 is obtained. Accordingly, as a pixel data, a difference data therebetween, that is, pix=sig−res=921 is obtained.

In the present embodiment, a maximum error at the time of clamping, namely, a worst case value of Vda0 when the reset level voltage is A/D converted is estimated between from V0 to V32. Therefore, when the full-scale range of the signal level A/D conversion, that is V0 to V64, is taken into consideration, the guarantee of data after digital CDS in the worst case is half as much as the full scale. Therefore, in the case of the present embodiment, consequently, the effective resolution of A/D conversion becomes 10 bits, or equivalent thereto, although the resolution of A/D conversion in the full scale is 11 bits.

Additionally, the column A/D converter according to the present invention is not limited to the aforementioned embodiment, and a variety of modifications can be made without departing from the scope of the present invention, needless to say. For example, in the present embodiment, the upper-level SAR and the lower-level SAR are set to be 6 bits and 5 bits, respectively, and the maximum error at the time of clamping is set to be ½ of the full scale. Under such conditions, the effective resolution of A/D conversion after the digital CDS becomes 10 bits or equivalent thereto. However, each number of bits in the upper-level SAR and the lower-level SAR is not limited to the above number. Further, if the error at the time of clamping is reduced by the reduction of the input offset of the comparator etc., a possible A/D conversion range is virtually widened, and therefore the effective resolution (that is, the number of gradation steps that can be expressed by digital values) can be made larger. As such, by optimally selecting and setting each number of bits of the upper-level SAR and the lower-level SAR and a clamping error, it may be self-evident to those skilled in the art that necessary resolution (number of gradation steps) required for the column A/D converter is achievable. Further, in the embodiment of the present application, the description has been given on an example of linear conversion of a sensor signal by using resistors and capacitors each having equal value in the upper-level and the lower-level D/A converters. However, by selecting appropriate values other than equal values for resistance and capacitance, it is also possible to configure an A/D converter that performs nonlinear conversion, such as a knee characteristic and a logarithmic conversion characteristic. Further, a single circuit is used for the digital CDS in the present embodiment. However, it may also be self-evident for those skilled in the art that, achievement can easily be made when a readout rate becomes high, by the selection of a plurality of columns in a column selection circuit, and by parallelization with the provision of a plurality of digital CDS circuits according thereto.

INDUSTRIAL APPLICABILITY

An A/D converter for an image sensor using the present column A/D converter can be used for a monitoring camera, an endoscope for medical treatment, an industrial two-dimensional image reading device, etc., not only a digital camera and a mobile-phone camera. Also, because of applicability to a special case that the number of rows is 1, that is a line sensor, the column A/D converter is usable to a one-dimensional image reading device, such as a facsimile device and a high speed scanner.

Although the invention has been described based upon these preferred and exemplary embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims.

What is claimed is:

1. An A/D converter unit for an image sensor, comprising:
   a plurality of column A/D converters for converting a plurality of analog image signals being output from the image sensor on a column-by-column basis into digital data simultaneously in parallel, and
   a reference voltage group supplier for supplying a reference voltage group having a plurality of reference voltages,
   wherein each column A/D converter includes
      a first D/A converter for selecting and outputting two reference voltages from among the reference voltage group,
      a second D/A converter for outputting a voltage ranging between an upper limit and a lower limit each determined by each of the two reference voltages output from the first D/A converter,
      a comparator for comparing each analog image signal voltage being output from the image sensor with the output voltage of the second D/A converter, and based on the output of the comparator,
      a controller for controlling the first and the second D/A converters so as to produce the output voltage of the second D/A converter substantially equal to each analog image signal voltage.

2. The A/D converter unit for the image sensor according to claim 1,
   wherein the reference voltage supplier includes an upper-side reference voltage source, a lower-side reference voltage source, and a resistor string circuit disposed therebetween, having series connection of a plurality of unit resistors at least greater in number than and inclusive of the number of gradation steps of the first D/A converter.

3. The A/D converter unit for the image sensor according to claim 2,
   wherein the first D/A converter outputs a first reference voltage and a second reference voltage produced at both ends of the unit resistor selected according to an output from the controller.

4. The A/D converter unit for the image sensor according to claim 1,
   wherein the second D/A converter includes a plurality of capacitors of different magnitudes, each one terminal being connected in common to an output terminal, and switches for switching whether the first reference voltage or the second reference voltage is to be supplied to each other terminal of the plurality of capacitors according to the output from the controller.

5. The A/D converter unit for the image sensor according to claim 1, further comprising:
   data retainers each of which retains a first digital data obtained from each column A/D converter which A/D converts a first voltage level during a first period in which the image sensor outputs a first voltage level, and a second digital data obtained from each column A/D converter which A/D converts a second voltage level during a second period in which the image sensor outputs a second voltage level, and
   a digital calculator for reading out the first digital data and the second digital data retained in the data retainer of the column A/D converter for outputting a subtracted data between the first digital data and the second digital data.

6. An image sensor unit comprising:
an image sensor having a plurality of photoelectric conversion elements arranged in a matrix shape to generate an analog signal according to incident light quantity, and
an A/D converter unit having a plurality of column A/D converters for converting a plurality of the analog signals being output from the image sensor on a column-by-column basis of the matrix into digital data simultaneously in parallel, and a reference voltage group supplier for supplying a reference voltage group having a plurality of reference voltages,
wherein each column A/D converter includes
a first D/A converter for selecting and outputting two reference voltages from among the reference voltage group,
a second D/A converter for outputting a voltage ranging between an upper limit and a lower limit each determined by each of the two reference voltages output from the first D/A converter,
a comparator for comparing each analog image signal voltage being output from the image sensor with the output voltage of the second D/A converter, and based on the output of the comparator,
a controller for controlling the first and the second D/A converters so as to produce the output voltage of the second D/A converter substantially equal to each analog image signal voltage.

* * * * *